(12) United States Patent
Xu et al.

(10) Patent No.: US 10,321,033 B2
(45) Date of Patent: Jun. 11, 2019

(54) LIGHT FIELD CAMERA

(71) Applicant: Huawei Technologies Co., Ltd., Shenzhen (CN)

(72) Inventors: Jing Xu, Shenzhen (CN); Cong Zhao, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 443 days.

(21) Appl. No.: 15/094,489

(22) Filed: Apr. 8, 2016

(65) Prior Publication Data

US 2016/0227085 A1     Aug. 4, 2016

Related U.S. Application Data

(63) Continuation of application No. PCT/CN2014/074914, filed on Apr. 8, 2014.

(30) Foreign Application Priority Data

Oct. 10, 2013   (CN) .......................... 2013 1 0469827

(51) Int. Cl.
  *G02B 3/00*   (2006.01)
  *G02F 1/29*   (2006.01)
  (Continued)

(52) U.S. Cl.
  CPC ......... *H04N 5/2254* (2013.01); *G02B 3/0037* (2013.01); *G02B 27/0075* (2013.01); *G02F 1/135* (2013.01); *G02F 1/133526* (2013.01); *H01L 27/14607* (2013.01); *H01L 27/14625* (2013.01); *H04N 5/225* (2013.01); *H04N 5/2253* (2013.01); *H04N 5/23212* (2013.01);
  (Continued)

(58) Field of Classification Search
  None
  See application file for complete search history.

(56) References Cited

U.S. PATENT DOCUMENTS

| 6,384,987 B1 * | 5/2002 | Sensui ................... G02B 13/04 |
| | | 359/749 |
| 7,962,033 B2 | 6/2011 | Georgiev et al. |
| (Continued) | | |

FOREIGN PATENT DOCUMENTS

| CN | 1860398 A | 11/2006 |
| CN | 101345826 A | 1/2009 |
| (Continued) | | |

Primary Examiner — Kate H Luo
(74) Attorney, Agent, or Firm — Slater Matsil, LLP

(57) ABSTRACT

Disclosed herein is a light field camera, where both a curved shape of a curved microlens array and a curved shape of a curved image sensor are the same as a curved shape of a wide-angle main lens, and a sum of a reciprocal of a vertical distance between the curved microlens array and the curved image sensor and a reciprocal of a vertical distance between the curved microlens array and a virtual image plane of the wide-angle main lens is equal to a reciprocal of a focal length of the curved microlens array, which resolves a problem of poor image quality such as blurring and distortion that is caused when a wide-angle main lens is used in a light field camera and a flat microlens array and a flat image sensor cannot match a curved virtual image plane of the wide-angle main lens.

18 Claims, 5 Drawing Sheets

(51) Int. Cl.
*G02B 27/00* (2006.01)
*G02F 1/135* (2006.01)
*H04N 5/225* (2006.01)
*H04N 5/232* (2006.01)
*G02F 1/1335* (2006.01)
*H01L 27/146* (2006.01)

(52) U.S. Cl.
CPC ... *H04N 5/23238* (2013.01); *G02F 2001/294* (2013.01); *G02F 2203/12* (2013.01)

(56) References Cited

U.S. PATENT DOCUMENTS

| | | | |
|---|---|---|---|
| 2004/0041914 A1* | 3/2004 | Peters, III | G01C 11/025 348/207.99 |
| 2006/0044451 A1* | 3/2006 | Liang | H04N 5/3415 348/340 |
| 2006/0285079 A1 | 12/2006 | Wada | |
| 2007/0188653 A1* | 8/2007 | Pollock | G01C 11/02 348/373 |
| 2009/0027542 A1 | 1/2009 | Yamamoto et al. | |
| 2009/0102956 A1 | 4/2009 | Georgiev | |
| 2010/0066812 A1 | 3/2010 | Kajihara et al. | |
| 2010/0277629 A1 | 11/2010 | Tanaka | |
| 2012/0050562 A1 | 3/2012 | Perwass et al. | |
| 2012/0127320 A1 | 5/2012 | Balogh | |

FOREIGN PATENT DOCUMENTS

| | | |
|---|---|---|
| CN | 101554042 A | 10/2009 |
| CN | 101874400 A | 10/2010 |
| CN | 102439979 A | 5/2012 |
| CN | 202455435 U | 9/2012 |
| CN | 102739949 A | 10/2012 |
| EP | 2306230 A1 | 4/2011 |

\* cited by examiner

LIGHT FIELD CAMERA

This application is a continuation of International Application No. PCT/CN2014/074914, filed on Apr. 8, 2014, which claims priority to Chinese Patent Application No. 201310469827.2, filed on Oct. 10, 2013, both of which are hereby incorporated by reference in their entireties.

TECHNICAL FIELD

The present invention relates to the field of image shooting and processing technologies, and in particular, to a light field camera.

BACKGROUND

A light field camera is a new imaging apparatus that can record both light intensity information and depth information (that is, complete light field information) of an object, and is widely used due to advantages such as digital refocusing. Currently, a light field camera mainly includes five parts: a main lens 1, a flat imaging array 2, a flat image sensor 3, an image processor 3, a drive 4, and a controller 5, as specifically shown in FIG. 1A.

The main lens 1 of the light field camera is generally a non-wide-angle lens, and the non-wide-angle main lens 1 images a shot object. A plane on which the image is located is an image plane (a plane a shown in FIG. 1A) of the non-wide-angle main lens 1. The image plane of the non-wide-angle main lens 1 is a virtual plane that is located between the non-wide-angle main lens 1 and the flat imaging array 2 and that is perpendicular to an optical axis. The optical axis is an axis parallel to a horizontal plane. An image distance (a distance b shown in FIG. 1A) of the non-wide-angle main lens 1 is a vertical distance between a side, near the flat imaging array 2, of the non-wide-angle main lens 1 and the virtual image plane a of the non-wide-angle main lens 1. An object plane (a plane c shown in FIG. 1A) of the non-wide-angle main lens 1 is a plane, near the side of the light field camera, of the shot object. An object distance (a distance d shown in FIG. 1A) of the non-wide-angle main lens 1 is a vertical distance between a side, near the shot object, of the non-wide-angle main lens 1 and the object plane of the non-wide-angle main lens 1.

A flat microlens array e includes multiple microlenses g, and the flat microlens array e needs to reimage an image generated on the virtual image plane a of the non-wide-angle main lens 1. A plane on which a reimaged image is located is a virtual image plane (a plane h shown in FIG. 1A) of the flat microlens array e. A plane including images generated by all the microlenses g is the virtual image plane h of the flat microlens array e. An image distance (a distance i shown in FIG. 1A) of the flat microlens array e is a vertical distance between a side, near the image processor 3, of the flat microlens array e and the virtual image plane h of the flat microlens array e. An object plane of the flat microlens array e is the virtual image plane a of the non-wide-angle main lens 1. An object distance (a distance j shown in FIG. 1A) of the flat microlens array e is a distance between a side, near the non-wide-angle main lens 1, of the flat microlens array e and the equivalent image plane a of the non-wide-angle main lens 1.

A relationship among the object distance j of the flat microlens array e, the image distance i of the flat microlens array e, and an equivalent focal length l of the flat microlens array e meets a formula $1/l = 1/j + 1/i$. The flat microlens array e needs to reimage the image generated on the virtual image plane a of the non-wide-angle main lens 1. Actually, each microlens g in the flat microlens array e needs to reimage the image generated on the virtual image plane a of the non-wide-angle main lens 1. Therefore, each microlens g in the flat microlens array e also has a corresponding microlens object distance $j_n$, a microlens equivalent image distance $i_n$, and a microlens equivalent focal length $l_n$, and $j_n$, $i_n$, and $l_n$ meet a formula $1/l_n = 1/j_n + 1/i_n$, where n is a number of a microlens. In FIG. 1A, numbers of all the microlenses g in the flat microlens array e are sequentially a number 1, a number 2, a number 3, a number 4, a number 5, a number 6, a number 7, and a number 8 from top to bottom.

In an imaging process, after reimaging the image formed on the virtual image plane a of the non-wide-angle main lens 1, the flat microlens array e needs to record the image on a flat image sensor f. In this case, if the virtual image plane h of the flat microlens array e coincides with a plane on which the flat image sensor f is located, or a vertical distance between the virtual image plane h of the flat microlens array e and a plane on which the flat image sensor f is located falls within a preset range, a finally shot image has high quality and is relatively clear. That is, when an image formed by each microlens g in the flat microlens array e is on the flat image sensor f, or when a vertical distance between the virtual image plane h on which the formed image is located and the flat image sensor f falls within a preset range, a finally shot image has high quality and is relatively clear.

Currently, a wide-angle main lens can collect a light ray with a larger incident angle than a non-wide-angle main lens, that is, has a larger visual angle. For example, a wide-angle main lens may have a visual angle of 180° or even 270° and can shoot more objects in space. Therefore, it is extremely important to replace a non-wide-angle main lens used in an existing light field camera with a wide-angle main lens. As shown in FIG. 1B, when a non-wide-angle main lens 1 used in the existing light field camera is replaced with a wide-angle main lens 1', an object plane of a flat microlens array e is a virtual image plane a' of the wide-angle main lens 1', a virtual image plane of the flat microlens array e is h', and an equivalent focal plane of the flat microlens array e is k'. When the non-wide-angle main lens used in the existing light field camera is replaced with the wide-angle main lens, because all microlenses are the same, the microlenses have a fixed refractive index to a light ray, that is, focal lengths $l_n$ of all the microlenses in the flat microlens array e are the same. Because a virtual image plane of the wide-angle main lens is curved, distances between all the microlenses g in the flat microlens array e and the virtual image plane of the wide-angle main lens are different, that is, object distances $j_n$ of all the microlenses are different. It may be learned according to the relationship among the object distance of each microlens, the image distance of each microlens, and the focal length of each microlens that are shown in the foregoing formula that, object distances $i_n$ of all the microlenses in the flat microlens array e are different. Because distances between all the microlenses g in the flat microlens array e and a flat image sensor f are the same, but image distances of all the microlenses g in the flat microlens array e are different, as specifically shown in FIG. 1B, after some microlenses g in the flat microlens array e reimage an image formed on the virtual image plane a' of the wide-angle lens, a virtual image plane on which the formed image is located is on the flat image sensor f, or a distance between a virtual image plane on which the formed image is located and the image sensor f falls within a preset range, and after the other microlenses g in the flat microlens array e reimage the image formed on the virtual image plane a' of the wide-angle lens, a vertical distance between a virtual image plane on which the image formed by reimage is located and the image sensor f has exceeded the preset range, thereby resulting in poor quality of a finally shot image and generating an aberration such as blurring or distortion.

SUMMARY

Embodiments provide a light field camera, so as to resolve a problem in the prior art that a shot image is blurred and has poor quality when a wide-angle lens is used in a light field camera for shooting.

According to a first aspect, a light field camera is provided, including:

a wide-angle main lens, configured to acquire an image signal and image the acquired image signal, where on the virtual image plane of the wide-angle main lens, a distance between an image point and an optical axis is directly proportional to a distance between an object point corresponding to the image point and the optical axis; and a curved imaging array including a curved microlens array and a curved image sensor, where the curved microlens array is configured to: reimage an image formed by means of imaging by the wide-angle main lens, and record, on the curved image sensor, an image formed by means of reimaging; where both a curved shape of the curved microlens array and a curved shape of the curved image sensor are the same as a curved shape of the virtual image plane of the wide-angle main lens, and a sum of a reciprocal of a vertical distance between the curved microlens array and the curved image sensor and a reciprocal of a vertical distance between the curved microlens array and the virtual image plane of the wide-angle main lens is equal to a reciprocal of a focal length of the curved microlens array.

With reference to the first aspect, in a first possible implementation manner, the wide-angle main lens is a zoom wide-angle main lens or a prime wide-angle main lens.

With reference to the first aspect or the first possible implementation manner of the first aspect, in a second possible implementation manner, a shape of the virtual image plane of the wide-angle main lens is a sphere, a hyperboloid, or any curved surface.

With reference to the first aspect or the first to the second possible implementation manners of the first aspect, in a third possible implementation manner, the curved microlens array includes at least one sequentially connected microlens, the curved image sensor includes at least one component image sensor, a quantity of component image sensors is the same as a quantity of microlenses, and each microlens is corresponding to one component image sensor; and for any microlens, a sum of a reciprocal of a vertical distance between the microlens and a component image sensor corresponding to the microlens and a reciprocal of a vertical distance between the microlens and the virtual image plane of the wide-angle main lens is equal to a reciprocal of a focal length of the microlens.

With reference to the third possible implementation manner of the first aspect, in a fourth possible implementation manner, any component image sensor is a charge coupled device (CCD) or a complementary metal-oxide-semiconductor (CMOS) light sensing component.

With reference to the first aspect or the first to the second possible implementation manners of the first aspect, in a fifth possible implementation manner, the curved microlens array includes at least one sequentially connected microlens, and the curved image sensor is shared by the at least one microlens; and for any microlens, a sum of a reciprocal of a vertical distance between the microlens and the curved image sensor and a reciprocal of a vertical distance between the microlens and the virtual image plane of the wide-angle main lens is equal to a reciprocal of a focal length of the microlens.

According to a second aspect, a light field camera is provided, including:

a wide-angle main lens, configured to acquire an image signal and image the acquired image signal, where on the virtual image plane of the wide-angle main lens, a distance between an image point and an optical axis is directly proportional to a distance between an object point corresponding to the image point and the optical axis;

a flat imaging array including a flat liquid-crystal spatial modulator and a curved image sensor, where the flat liquid-crystal spatial modulator is configured to: reimage an image formed by means of imaging by the wide-angle main lens, and record, on the curved image sensor, an image formed by means of reimaging; and a drive, configured to: in a process in which the flat liquid-crystal spatial modulator reimages the image formed by means of imaging by the wide-angle main lens, apply a voltage to the flat liquid-crystal spatial modulator to adjust a refractive index of the flat liquid-crystal spatial modulator and change a focal length of the flat liquid-crystal spatial modulator; where a sum of a reciprocal of a vertical distance between the flat liquid-crystal spatial modulator and the curved image sensor and a reciprocal of a vertical distance between the flat liquid-crystal spatial modulator and the virtual image plane of the wide-angle main lens is equal to a reciprocal of the focal length of the flat liquid-crystal spatial modulator.

With reference to the second aspect, in a first possible implementation manner, the wide-angle main lens is a zoom wide-angle main lens or a prime wide-angle main lens.

With reference to the second aspect or the first possible implementation manner of the second aspect, in a second possible implementation manner, a shape of the wide-angle main lens is a sphere, a hyperboloid, or any curved surface.

With reference to the second aspect, in a third possible implementation manner, the flat liquid-crystal spatial modulator includes at least one sequentially connected liquid crystal unit; and for any liquid crystal unit, a sum of a reciprocal of a vertical distance between the liquid crystal unit and the curved image sensor and a reciprocal of a vertical distance between the liquid crystal unit and the virtual image plane of the wide-angle main lens is equal to a reciprocal of a focal length of the liquid crystal unit.

With reference to the second aspect, in a fourth possible implementation manner, the flat liquid-crystal spatial modulator is an entire liquid crystal panel.

In the presented embodiments, two light field cameras are provided.

One light field camera mainly includes a wide-angle main lens and a curved imaging array. The wide-angle main lens is configured to acquire an image signal and image the acquired image signal, and on a virtual image plane of the wide-angle main lens, a distance between an image point and an optical axis is directly proportional to a distance between an object point corresponding to the image point and the optical axis. The curved imaging array includes a curved microlens array and a curved image sensor, where the curved microlens array is configured to: reimage an image formed by means of imaging by the wide-angle main lens, and record, on the curved image sensor, an image formed by means of reimaging. Both a curved shape of the curved microlens array and a curved shape of the curved image sensor are the same as a curved shape of the virtual image plane of the wide-angle main lens, and a sum of a reciprocal of a vertical distance between the curved microlens array and the curved image sensor and a reciprocal of a vertical distance between the curved microlens array and the virtual image plane of the wide-angle main lens is equal to a reciprocal of a focal length of the curved microlens array. In this solution, both the curved shape of the curved microlens array and the curved shape of the curved image sensor are the same as the curved shape of the virtual image plane of the wide-angle main lens, and in this case, it only ensures that a shape of a virtual image plane formed after the curved microlens array reimages the image formed by means of imaging by the wide-angle main lens is the same as that of a plane on which the curved image sensor is located. However, to further ensure that the image formed after the curved microlens array reimages the image formed by means of imaging by the wide-angle main lens falls on the curved image sensor, that is, the virtual image plane formed after the curved microlens array reimages the image formed by means of imaging by the wide-angle main lens coincides with the plane on which the curved image sensor is located, or a vertical distance between the two planes is relatively small, it is further required that the sum of the reciprocal of the vertical distance between the curved microlens array and the curved image sensor and the reciprocal of the vertical distance between the curved microlens array and the virtual image plane of the wide-angle main lens be equal to a reciprocal of a vertical distance between the curved microlens array and an equivalent focal plane of the curved microlens array. In this way, the image formed after the curved microlens array reimages the image formed by means of imaging by the wide-angle main lens falls on the curved image sensor, and a problem that a shot image is blurred and has poor quality when a wide-angle lens is used in a light field camera for shooting is resolved.

The other light field camera mainly includes a wide-angle main lens, a flat imaging array, and a drive. The wide-angle main lens is configured to acquire an image signal and image the acquired image signal, and on a virtual image plane of the wide-angle main lens, a distance between an image point and an optical axis is directly proportional to a distance between an object point corresponding to the image point and the optical axis. The flat imaging array includes a flat liquid-crystal spatial modulator and a curved image sensor, where the flat liquid-crystal spatial modulator is configured to: reimage an image formed by means of imaging by the wide-angle main lens, and record, on the curved image sensor, an image formed by means of reimaging. The drive is configured to: in a process in which the flat liquid-crystal spatial modulator reimages the image formed by means of imaging by the wide-angle main lens, apply a voltage to the flat liquid-crystal spatial modulator to adjust a refractive index of the flat liquid-crystal spatial modulator and change a focal length of the flat liquid-crystal spatial modulator. A sum of a reciprocal of a vertical distance between the flat liquid-crystal spatial modulator and the curved image sensor and a reciprocal of a vertical distance between the flat liquid-crystal spatial modulator and the virtual image plane of the wide-angle main lens is equal to a reciprocal of the focal length of the flat liquid-crystal spatial modulator. In this solution, to ensure that the image formed after the flat liquid-crystal spatial modulator reimages the image formed by means of imaging by the wide-angle main lens falls on the curved image sensor, that is, a virtual image plane formed after the flat liquid-crystal spatial modulator reimages the image formed by means of imaging by the wide-angle main lens coincides with a plane on which the curved image sensor is located, or a distance between the two planes is relatively small, the sum of the reciprocal of the vertical distance between the flat liquid-crystal spatial modulator and the curved image sensor and the reciprocal of the vertical distance between the flat liquid-crystal spatial modulator and the virtual image plane of the wide-angle main lens needs to be equal to the reciprocal of the focal length of the flat liquid-crystal spatial modulator. In this way, the image formed after the flat liquid-crystal spatial modulator reimages the image formed by means of imaging by the wide-angle main lens falls on the curved image sensor, and a problem that a shot image is blurred and has poor quality when a wide-angle lens is used in a light field camera for shooting is resolved.

DETAILED DESCRIPTION OF ILLUSTRATIVE EMBODIMENTS

In some embodiments, two light field cameras are provided, avoiding a shot image that is blurred and has poor quality when a wide-angle lens is used in a light field camera. Both a curved shape of a curved microlens array and a curved shape of a curved image sensor are the same as a curved shape of a virtual image plane of a wide-angle main lens, and a sum of a reciprocal of a vertical distance between the curved microlens array and the curved image sensor and a reciprocal of a vertical distance between the curved microlens array and the virtual image plane of the wide-angle main lens is equal to a reciprocal of a focal length of the curved microlens array, a shot image that is blurred and has poor quality when a wide-angle lens is used in a light field camera for shooting is avoided. Additionally, a sum of a reciprocal of a vertical distance between a flat liquid-crystal spatial modulator and a curved image sensor and a reciprocal of a vertical distance between the flat liquid-crystal spatial modulator and a virtual image plane of a wide-angle main lens is equal to a reciprocal of a focal length of the flat liquid-crystal spatial modulator, and a shot image that is blurred and has poor quality when a wide-angle lens is used in a light field camera for shooting is avoided.

The following describes implementation manners of the present embodiments in detail with reference to the accompanying drawings.

Figure 1A:
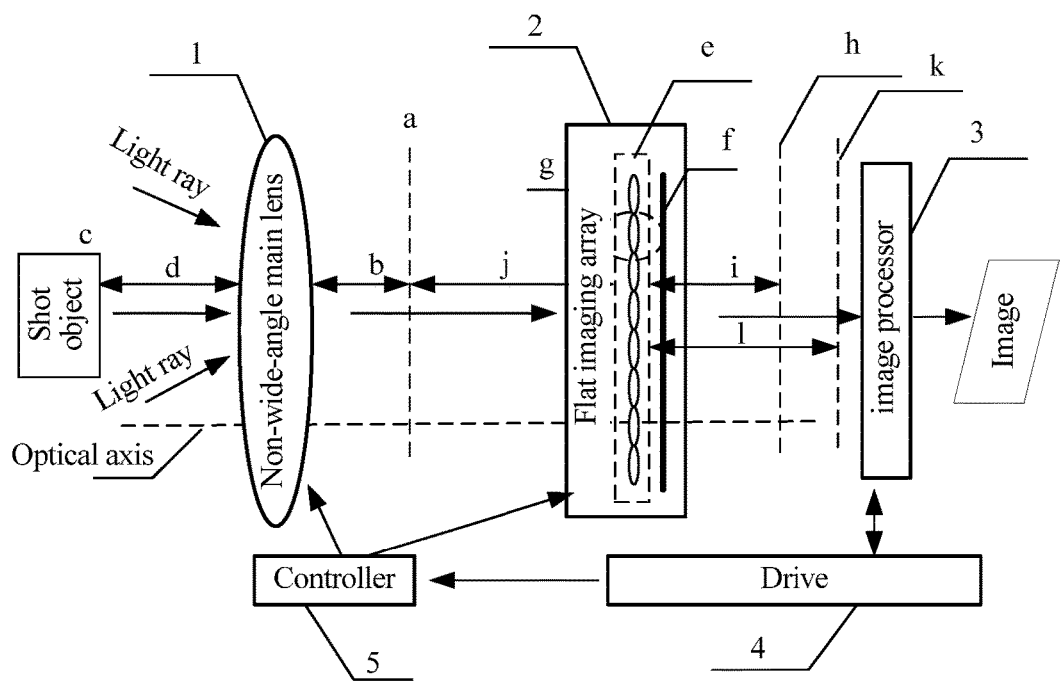
FIG. 1A is a schematic structural diagram of a light field camera using a non-wide-angle main lens in the prior art.
Figure 1B:
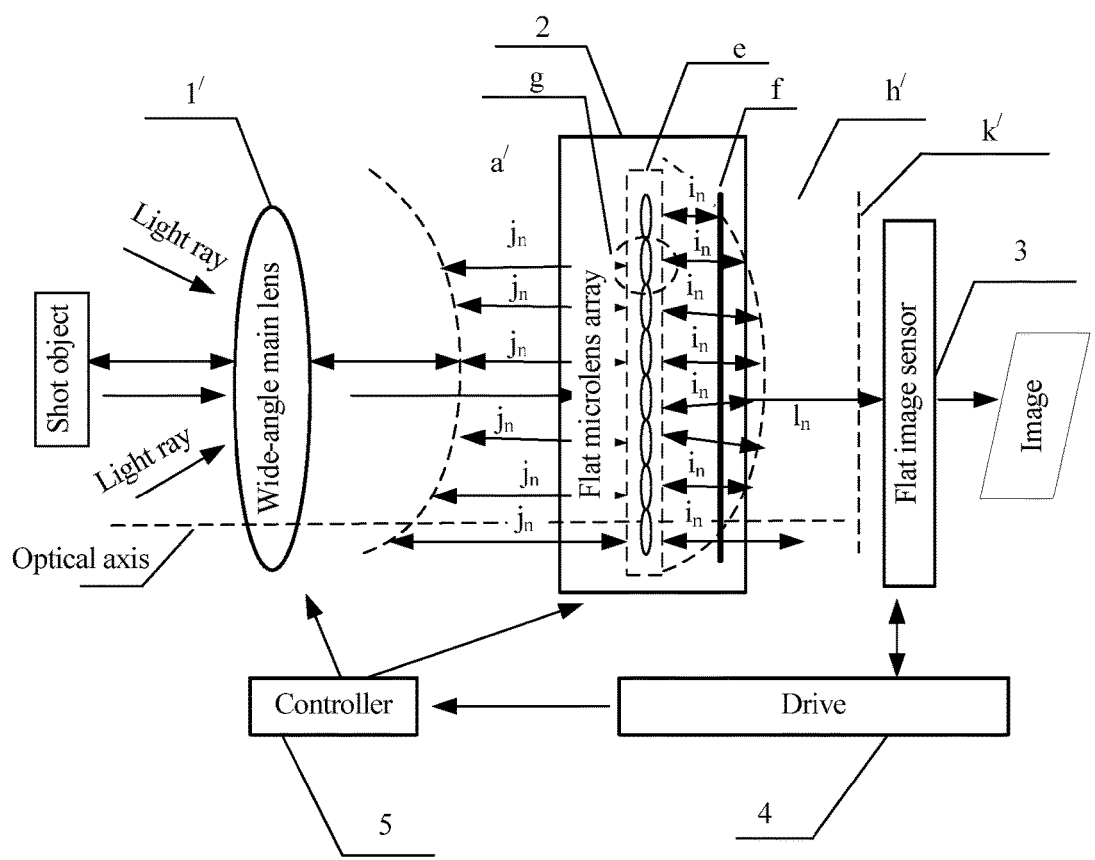
FIG. 1B is a schematic structural diagram of a light field camera using a wide-angle main lens in the prior art.
Figure 2A:
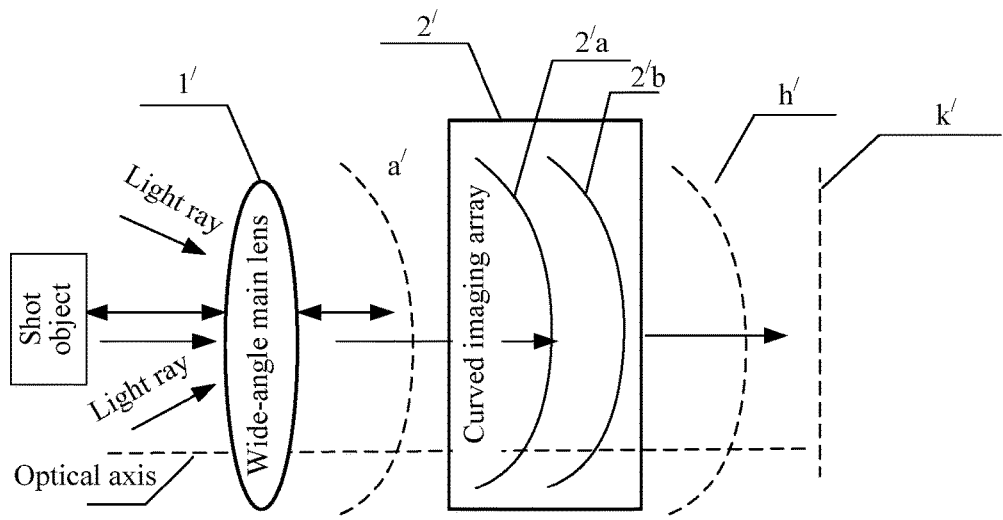
FIG. 2A is a schematic structural diagram of a light field camera according to a first embodiment.

Referring to FIG. 2A, a light field camera according to a first embodiment is as follows:

The light field camera according to the first embodiment includes:

a wide-angle main lens 1', where the wide-angle main lens 1' is configured to acquire an image signal and image the acquired image signal, and on a virtual image plane a' of the wide-angle main lens, a distance between an image point and an optical axis is directly proportional to a distance between an object point corresponding to the image point and the optical axis; and a curved imaging array 2', where the curved imaging array 2' includes a curved microlens array 2'a and a curved image sensor 2'b, and the curved microlens array 2'a is configured to: reimage an image formed by means of imaging by the wide-angle main lens 1', and record, on the curved image sensor 2'b, an image formed by means of reimaging; where both a curved shape of the curved microlens array 2'a and a curved shape of the curved image sensor 2'b are the same as a curved shape of the virtual image plane a' of the wide-angle main lens, and a sum of a reciprocal of a vertical distance between the curved microlens array 2'a and the curved image sensor 2'b and a reciprocal of a vertical distance between the curved microlens array 2'a and the virtual image plane a' of the wide-angle main lens is equal to a reciprocal of a focal length from the curved microlens array 2'a to the curved microlens array.

In this embodiment, the wide-angle main lens 1' has multiple types. Preferably, the wide-angle main lens 1' is a zoom wide-angle main lens, or the wide-angle main lens 1' is a prime wide-angle main lens.

In this embodiment, the wide-angle main lens 1' has multiple shapes. Preferably, a shape of the wide-angle main lens 1' is a sphere, or a shape of the wide-angle main lens 1' is a hyperboloid, or a shape of the wide-angle main lens 1' is any curved surface.

It should be noted that, in this embodiment, the wide-angle main lens and a body of the light field camera may be configured as a detachable structure (for example, the wide-angle main lens may be combined with or separated from the body of the light field camera, so as to meet a requirement of switching between multiple lenses) or a fixedly connected structure (for example, the wide-angle main lens and the body of the light field camera may be in an integrated structure), which is not limited in this embodiment. In an actual application, a manufacturer of the wide-angle main lens may be the same as or different from a manufacturer of the body of the light field camera.

Figure 2B:
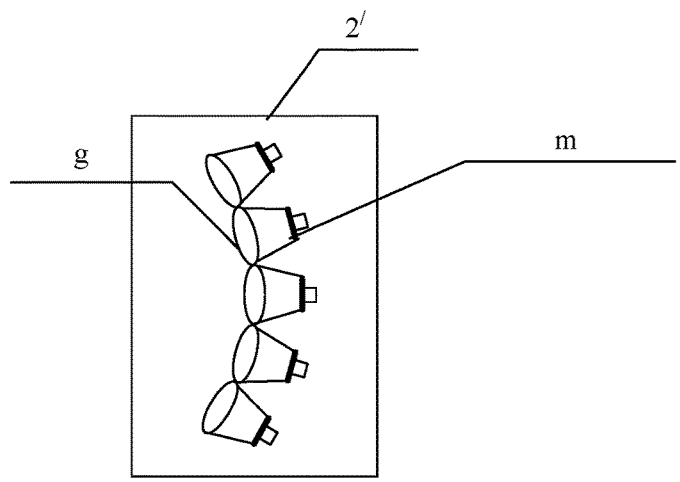
FIG. 2B shows a first implementation manner of a curved imaging array of the light field camera according to the first embodiment.

In this embodiment, the curved imaging array 2' may be in multiple forms. Preferably, the curved microlens array 2'a in the curved imaging array 2' includes at least one sequentially connected microlens g, and the curved image sensor 2'b included in the curved imaging array 2' includes at least one component image sensor m. As shown in FIG. 2B, a quantity of component image sensors m is the same as a quantity of microlenses g, and each microlens g is corresponding to one component image sensor m. For any microlens g, a sum of a reciprocal of a vertical distance between the microlens g and a component image sensor m connected to the microlens g and a reciprocal of a vertical distance between the microlens g and the virtual image plane of the wide-angle main lens is equal to a reciprocal of a focal length of the microlens g.

In the foregoing solution, because the curved microlens array 2'a includes multiple microlenses g, and the microlenses g are sequentially connected to form the curved microlens array 2'a, the curved microlens array 2'a may be in a curved shape. In addition, because the curved image sensor 2'b includes multiple component image sensors m, and each microlens g is connected to one component image sensor m, if the curved microlens array 2'a formed by the sequentially connected microlenses g is curved, the curved image sensor 2'b formed by the multiple component image sensors m may also be in a curved shape. In this way, it can be implemented that both the curved shape of the curved microlens array 2'a and the curved shape of the curved image sensor 2'b are the same as the curved shape of the virtual image plane a' of the wide-angle main lens. In this embodiment, to ensure that an image formed after the curved microlens array 2'a reimages an image formed by the wide-angle main lens 1' falls on the curved image sensor 2'b, it is not only required that both the curved shape of the curved microlens array 2'a and the curved shape of the curved image sensor 2'b be the same as the curved shape of the virtual image plane a' of the wide-angle main lens, but it is also required that a virtual image plane h' on which the image formed after the curved microlens array 2'a reimages the image formed by the wide-angle main lens 1' is located coincide with a curved surface of the curved image sensor 2'b, or a vertical distance between the two planes be less than an aberration tolerance. To meet a condition that the virtual image plane h' on which the image formed after the curved microlens array 2'a reimages the image formed by the wide-angle main lens 1' is located coincides with the curved surface of the curved image sensor 2'b or the vertical distance between the two planes is less than the aberration tolerance, it is further required that a vertical distance between the curved microlens array 2'a and the curved image sensor 2'b, a vertical distance between the curved microlens array 2'a and the virtual image plane a' of the wide-angle main lens, and a focal length of the curved microlens array 2'a meet a preset rule. For example, for any microlens g that forms the curved microlens array 2'a, a sum of a reciprocal of a vertical distance between the microlens g and a component image sensor m connected to the microlens g and a reciprocal of a vertical distance between the microlens g and the virtual image plane a' of the wide-angle main lens is equal to a reciprocal of a focal length of the microlens g. In this way, it is implemented that the image formed after the curved microlens array 2'a reimages the image formed by the wide-angle main lens 1' falls on the curved image sensor 2'b, and a problem in the prior art that a shot image is blurred and has poor quality when a wide-angle lens is used in a light field camera for shooting is resolved.

In this embodiment, the any microlens g may include one or more lenses.

In this embodiment, the component image sensor m may be in multiple forms, for example, may be a charge coupled device (CCD), or may be a complementary metal-oxide-semiconductor (CMOS) light sensing component.

Figure 2C:
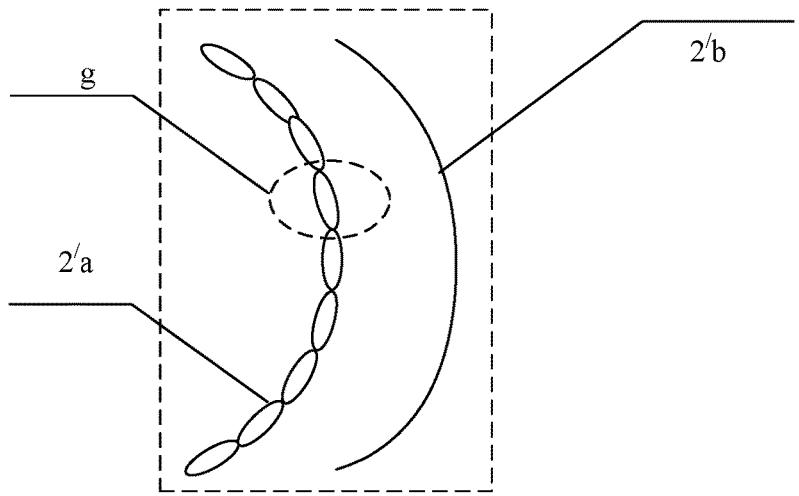
FIG. 2C shows a second implementation manner of a curved imaging array of the light field camera according to the first embodiment.

Alternatively, a form of the curved imaging array 2' may also be as follows: The curved microlens array 2'a in the curved imaging array 2' includes at least one sequentially connected microlens g, and the curved image sensor 2'b included in the curved imaging array 2' is shared by the at least one microlens g. As shown in FIG. 2C, for any microlens g, a sum of a reciprocal of a vertical distance between the microlens g and the curved image sensor 2'b and a reciprocal of a vertical distance between the microlens g and the virtual image plane a' of the wide-angle main lens is equal to a reciprocal of a focal length of the microlens g.

In the foregoing solution, the microlens may be a solid microlens, a liquid microlens, or a liquid crystal microlens, where the solid microlens may be made of a glass material or a plastic material, and the liquid microlens may be a liquid lens or a fluid lens.

In the foregoing solution, because the curved microlens array 2'a includes multiple microlenses g, and the microlenses g are sequentially connected to form the curved microlens array 2'a, the curved microlens array 2'a may be in a curved shape, and it can be implemented that a curved shape of the curved microlens array 2'a is the same as a curved shape of the virtual image plane a' of the wide-angle main lens. Because the curved image sensor 2'b is an entire curved image sensor and is shared by all the microlenses g in the curved microlens array 2'a, it can also be implemented that the curved shape of the curved image sensor 2'b is the same as the curved shape of the virtual image plane a' of the wide-angle main lens. To ensure that an image formed after the curved microlens array 2'a reimages an image formed by the wide-angle main lens 1' falls on the curved image sensor 2'b, it is not only required that both the curved shape of the curved microlens array 2'a and the curved shape of the curved image sensor 2'b be the same as the curved shape of the virtual image plane a' of the wide-angle main lens, but it is also required that a virtual image plane h' on which the image formed after the curved microlens array 2'a reimages the image formed by the wide-angle main lens 1' is located coincide with a curved surface of the curved image sensor 2'b, or a vertical distance between the two planes be less than an aberration tolerance. To meet a condition that the virtual image plane h' on which the image formed after the curved microlens array 2'a reimages the image formed by the wide-angle main lens 1' is located coincides with the curved surface of the curved image sensor 2'b or the vertical distance between the two planes is less than the aberration tolerance, it is further required that a vertical distance between the curved microlens array 2'a and the curved image sensor 2'b, a vertical distance between the curved microlens array 2'a and the virtual image plane a' of the wide-angle main lens, and a focal length of the curved microlens array 2'a meet a preset rule. For example, for any microlens g that forms the curved microlens array 2'a, a sum of a reciprocal of a vertical distance between the microlens g and the curved image sensor 2'b and a reciprocal of a vertical distance between the microlens g and the virtual image plane a' of the wide-angle main lens is equal to a reciprocal of a focal length of the microlens g. In this way, it is implemented that the image formed after the curved microlens array 2'a reimages the image formed by the wide-angle main lens 1' falls on the curved image sensor 2'b, and a problem in the prior art that a shot image is blurred and has poor quality when a wide-angle lens is used in a light field camera for shooting is resolved.

Figure 3A:
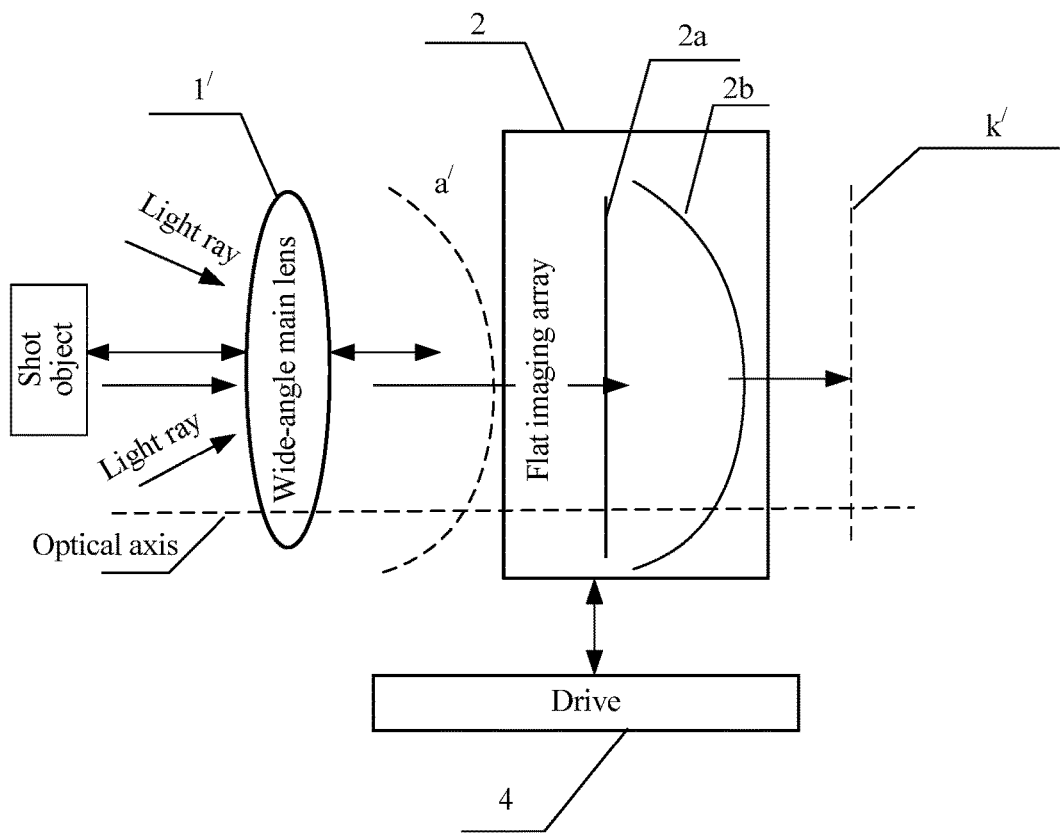
FIG. 3A is a schematic structural diagram of a light field camera according to a second embodiment.
Figure 3B:
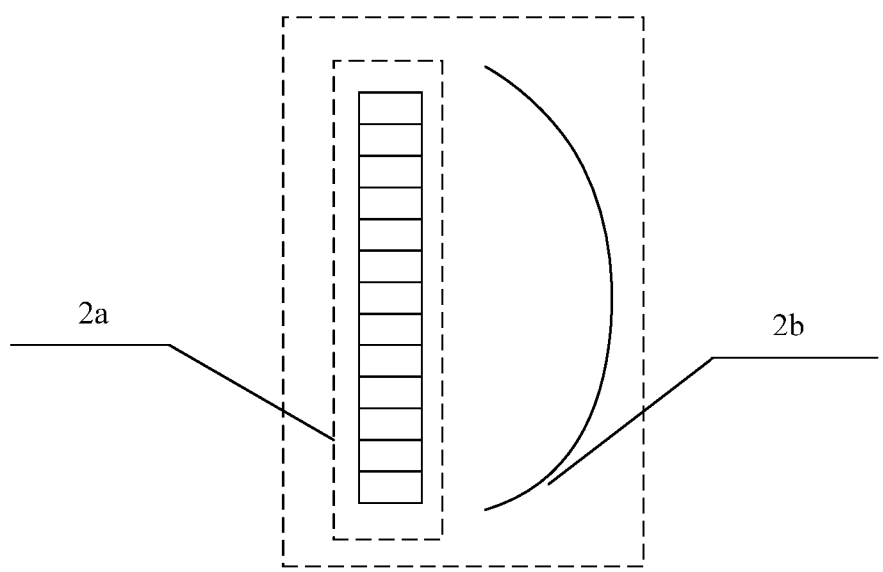
FIG. 3B shows a first implementation manner of a flat imaging array of the light field camera according to the second embodiment.

Referring to FIG. 3A and FIG. 3B, a light field camera according to a second embodiment is as follows:

The light field camera according to the second embodiment includes:

a wide-angle main lens 1', where the wide-angle main lens 1' is configured to acquire an image signal and image the acquired image signal, and on a virtual image plane of the wide-angle main lens 1', a distance between an image point and an optical axis is directly proportional to a distance between an object point corresponding to the image point and the optical axis;

a flat imaging array 2, where the flat imaging array 2 includes a flat liquid-crystal spatial modulator 2a and a curved image sensor 2b, and the flat liquid-crystal spatial modulator 2a is configured to: reimage an image formed by the wide-angle main lens 1', and record, on the curved image sensor 2b, an image formed by means of reimaging; and a drive 4, configured to: in a process in which the flat liquid-crystal spatial modulator 2a reimages the image formed by means of imaging by the wide-angle main lens 1', apply a voltage to the flat liquid-crystal spatial modulator 2a to adjust a refractive index of the flat liquid-crystal spatial modulator 2a and change a focal length of the flat liquid-crystal spatial modulator 2a; where after the refractive index of the flat liquid-crystal spatial modulator 2a is adjusted, the flat liquid-crystal spatial modulator 2a may equivalently form a curved microlens array; and a sum of a reciprocal of a vertical distance between the flat liquid-crystal spatial modulator 2a and the curved image sensor 2b and a reciprocal of a vertical distance between the flat liquid-crystal spatial modulator 2a and the virtual image plane a' of the wide-angle main lens is equal to a reciprocal of the focal length of the flat liquid-crystal spatial modulator.

In this embodiment, the wide-angle main lens 1' is in multiple forms. Preferably, the wide-angle main lens 1' is a zoom wide-angle main lens, or the wide-angle main lens 1' is a prime wide-angle main lens.

In this embodiment, the wide-angle main lens 1' is in multiple shapes. Preferably, a shape of the wide-angle main lens 1' is a sphere, a hyperboloid, or any curved surface.

In this embodiment, the flat imaging array 2 is in multiple forms. Preferably, the flat liquid-crystal spatial modulator 2a includes at least one sequentially connected liquid crystal unit g; and for any liquid crystal unit g, a sum of a reciprocal of a vertical distance between the liquid crystal unit g and the curved image sensor 2b and a reciprocal of a vertical distance between the liquid crystal unit g and the virtual image plane a' of the wide-angle main lens is equal to a reciprocal of a focal length of the liquid crystal unit g.

In the foregoing solution, after a voltage is applied to any liquid crystal unit, the any liquid crystal unit may equivalently form a microlens that has a specific focal length, and when voltages applied to liquid crystal units are different, specific focal lengths of equivalent microlenses are also different.

In the foregoing solution, the virtual image plane of the wide-angle main lens 1' is curved, the flat liquid-crystal spatial modulator 2a that reimages the image formed by the wide-angle main lens 1' is in a flat shape, and the curved image sensor 2b that records the image formed after the flat liquid-crystal spatial modulator 2a reimages the image formed by the wide-angle main lens 1' is also curved. Therefore, to ensure that the image formed after the flat liquid-crystal spatial modulator 2a reimages the image formed by the wide-angle main lens 1' falls on the curved image sensor 2b, it is required that a virtual image plane h' on which the image formed after the flat liquid-crystal spatial modulator 2a reimages the image formed by the wide-angle main lens 1' is located coincide with a curved surface of the curved image sensor 2b, or a vertical distance between the two planes be less than an aberration tolerance. To meet the foregoing condition, in a process in which the flat liquid-crystal spatial modulator 2a reimages the image formed by means of imaging by the wide-angle main lens 1', the drive 4 applies a voltage to the flat liquid-crystal spatial modulator 2a to adjust a refractive index of the flat liquid-crystal spatial modulator 2a, so that a sum of a reciprocal of a vertical distance between the flat liquid-crystal spatial modulator 2a and the flat image sensor 2b and a reciprocal of a vertical distance between the flat liquid-crystal spatial modulator 2a and the virtual image plane a' of the wide-angle main lens is equal to a reciprocal of a focal length, which is obtained after the drive 4 applies the voltage, of the flat liquid-crystal spatial modulator 2a. Because the flat liquid-crystal spatial modulator 2a includes multiple liquid crystal units g, that the drive 4 adjusts the refractive index of the flat liquid-crystal spatial modulator 2a is to adjust a refractive index of any liquid crystal unit g that forms the flat liquid-crystal spatial modulator 2a, so that each liquid crystal unit forms an equivalent microlens, and for any liquid crystal unit g, a sum of a reciprocal of a vertical distance between the liquid crystal unit g and the curved image sensor 2b and a reciprocal of a vertical distance between the liquid crystal unit g and the virtual image plane a' of the wide-angle main lens is equal to a reciprocal of a focal length of the liquid crystal unit g. In this way, the image formed after the flat liquid-crystal spatial modulator 2a reimages the curved image formed by means of imaging by the wide-angle main lens 1' falls on the curved image sensor 2b, and a problem in the prior art that a shot image is blurred and has poor quality when a wide-angle lens is used in a light field camera for shooting is resolved.

In conclusion, the light field camera provided in the first embodiment mainly includes a wide-angle main lens and a curved imaging array, where the curved imaging array mainly includes a curved microlens array and a curved image sensor, both a curved shape of the curved microlens array and a curved shape of the curved image sensor are the same as a curved shape of a virtual image plane of the wide-angle main lens, and a sum of a reciprocal of a vertical distance between the curved microlens array and the curved image sensor and a reciprocal of a vertical distance between the curved microlens array and the virtual image plane of the wide-angle main lens is equal to a reciprocal of a focal length of the curved microlens array. In this way, it is implemented that an image formed after the curved microlens array reimages an image formed by the wide-angle main lens falls on the curved image sensor, and a shot image is blurred and has poor quality when a wide-angle lens is used in a light field camera for shooting is avoided. The light field camera provided in the second embodiment mainly includes a wide-angle main lens, a flat liquid-crystal spatial modulator, a curved image sensor, and a drive, where a sum of a reciprocal of a vertical distance between the flat liquid-crystal spatial modulator and the curved image sensor and a reciprocal of a vertical distance between the flat liquid-crystal spatial modulator and a virtual image plane of the wide-angle main lens is equal to a reciprocal of a focal length of the flat liquid-crystal spatial modulator. In this way, an image formed after the flat liquid-crystal spatial modulator reimages an image formed by the wide-angle main lens falls on the curved image sensor, and a shot image is blurred and has poor quality when a wide-angle lens is used in a light field camera for shooting is avoided.

Persons skilled in the art should understand that the embodiments may be provided as a method, an apparatus (device), or a computer program product. A form of hardware only embodiments, software only embodiments, or embodiments with a combination of software and hardware may be used. Moreover, the embodiments may use a form of a computer program product that is implemented on one or more computer-usable storage media (including but not limited to a disk memory, a CD-ROM, an optical memory, and the like) that include computer-usable program code.

The embodiments are described with reference to the flowcharts and/or block diagrams of the method, the apparatus (device), and the computer program product according to the embodiments. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or any other programmable data processing device, so that a series of operations and steps are performed on the computer or the any other programmable device, so as to generate computer-implemented processing. Therefore, the instructions executed on the computer or the any other programmable device provide steps for implementing a specific function in one or more processes in the flowcharts and/or in one or more blocks in the block diagrams.

Although some embodiments have been described, persons skilled in the art can make changes and modifications to these embodiments once they learn the basic inventive concept. Therefore, the following claims are intended to be construed as to cover the embodiments and all changes and modifications falling within the scope of the embodiments.

Obviously, persons skilled in the art can make various modifications and variations to the embodiments without departing from the spirit and scope of disclosed techniques. The embodiments are intended to cover these modifications and variations provided that they fall within the protection scope defined by the following claims and their equivalent technologies.

What is claimed is:
1. A light field camera, comprising:
a wide-angle main lens, configured to acquire an image signal and image the acquired image signal, wherein, on a virtual image plane of the wide-angle main lens, a distance between an image point and an optical axis is directly proportional to a distance between an object point corresponding to the image point and the optical axis; and
a curved imaging array comprising a curved microlens array and a curved image sensor, wherein the curved microlens array is configured to reimage an image formed through imaging by the wide-angle main lens, and record, on the curved image sensor, an image formed by means of reimaging, wherein a first side of the curved microlens array facing the wide-angle main lens is concave, and wherein a first side of the curved image sensor facing the wide-angle main lens is concave;

wherein both a curved shape of the curved microlens array and a curved shape of the curved image sensor are the same as a curved shape of the virtual image plane of the wide-angle main lens, and wherein a sum of a reciprocal of a vertical distance between the curved microlens array and the curved image sensor and a reciprocal of a vertical distance between the curved microlens array and the virtual image plane of the wide-angle main lens is equal to a reciprocal of a focal length of the curved microlens array.

2. The light field camera according to claim 1, wherein the wide-angle main lens is one of a zoom wide-angle main lens or a prime wide-angle main lens.

3. The light field camera according to claim 1, wherein a shape of the virtual image plane of the wide-angle main lens is one of a sphere, a hyperboloid, or a curved surface.

4. The light field camera according to claim 1, wherein the curved microlens array comprises at least one sequentially connected microlens, wherein the curved image sensor comprises at least one component image sensor, wherein a quantity of component image sensors is the same as a quantity of microlenses, and wherein each microlens corresponds to one component image sensor; and wherein, for any microlens, a sum of a reciprocal of a vertical distance between the respective microlens and a component image sensor corresponding to the respective microlens and a reciprocal of a vertical distance between the respective microlens and the virtual image plane of the wide-angle main lens is equal to a reciprocal of a focal length of the respective microlens.

5. The light field camera according to claim 4, wherein the component image sensor is one of a charge coupled device (CCD) or a complementary metal-oxide-semiconductor (CMOS) light sensing component.

6. The light field camera according to claim 1, wherein the curved microlens array comprises at least one sequentially connected microlens, and the curved image sensor is shared by the at least one microlens; and for any microlens, a sum of a reciprocal of a vertical distance between the microlens and the curved image sensor and a reciprocal of a vertical distance between the microlens and the virtual image plane of the wide-angle main lens is equal to a reciprocal of a focal length of the microlens.

7. A light field camera, comprising:
a wide-angle main lens, configured to acquire an image signal and image the acquired image signal, wherein, on a virtual image plane of the wide-angle main lens, a distance between an image point and an optical axis is directly proportional to a distance between an object point corresponding to the image point and the optical axis, and wherein the virtual image plane has a first portion that is curved concavely on a side facing the wide-angle main lens; and
a curved imaging array comprising a curved microlens array and a curved image sensor, wherein the curved microlens array is configured to reimage an image formed through imaging by the wide-angle main lens, and record, on the curved image sensor, an image formed by the reimaging, wherein a first side of the curved microlens array facing the wide-angle main lens is concave, wherein a first side of the curved image sensor facing the wide-angle main lens is concave;

wherein both a curved shape of the curved microlens array and a curved shape of the curved image sensor are the same as a curved shape of the virtual image plane of the wide-angle main lens; and wherein a sum of a reciprocal of a vertical distance between the curved microlens array and the curved image sensor and a reciprocal of a vertical distance between the curved microlens array and the virtual image plane of the wide-angle main lens is equal to a reciprocal of a focal length of the curved microlens array.

8. The light field camera according to claim 7, wherein the wide-angle main lens is one of a zoom wide-angle main lens or a prime wide-angle main lens.

9. The light field camera according to claim 7, wherein a shape of the virtual image plane of the wide-angle main lens is one of a sphere, a hyperboloid, or a curved surface.

10. The light field camera according to claim 7, wherein the curved microlens array comprises at least one sequentially connected microlens, wherein the curved image sensor comprises at least one component image sensor, wherein a quantity of component image sensors is the same as a quantity of microlenses, and wherein each microlens corresponds to one component image sensor; and wherein, for any microlens, a sum of a reciprocal of a vertical distance between the respective microlens and a component image sensor corresponding to the respective microlens and a reciprocal of a vertical distance between the respective microlens and the virtual image plane of the wide-angle main lens is equal to a reciprocal of a focal length of the respective microlens.

11. The light field camera according to claim 10, wherein the component image sensor is one of a charge coupled device (CCD) or a complementary metal-oxide-semiconductor (CMOS) light sensing component.

12. The light field camera according to claim 7, wherein the curved microlens array comprises at least one sequentially connected microlens, and the curved image sensor is shared by the at least one microlens; and wherein, for any microlens, a sum of a reciprocal of a vertical distance between the microlens and the curved image sensor and a reciprocal of a vertical distance between the microlens and the virtual image plane of the wide-angle main lens is equal to a reciprocal of a focal length of the microlens.

13. A light field camera, comprising:
a wide-angle main lens, configured to acquire an image signal and image the acquired image signal, wherein, on a first virtual image plane of the wide-angle main lens, a distance between an image point and an optical axis is directly proportional to a distance between an object point corresponding to the image point and the optical axis; and
a curved imaging array comprising a curved microlens array and a curved image sensor, wherein the curved microlens array is configured to reimage, onto a second virtual image plane that coincides, an image formed through imaging by the wide-angle main lens, and wherein the curved microlens array is further configured to record, on the curved image sensor, an image formed by the reimaging, wherein a first side of the curved microlens array facing the wide-angle main lens is concave, and wherein the second virtual image plane coincides with a surface at the first side of the curved image sensor;

wherein both a curved shape of the curved microlens array and a curved shape of the curved image sensor are the same as a curved shape of the first virtual image plane of the wide-angle main lens, and wherein a sum of a reciprocal of a vertical distance between the curved microlens array and the curved image sensor and a reciprocal of a vertical distance between the curved microlens array and the first virtual image plane of the wide-angle main lens is equal to a reciprocal of a focal length of the curved microlens array.

14. The light field camera according to claim 13, wherein the wide-angle main lens is one of a zoom wide-angle main lens or a prime wide-angle main lens.

15. The light field camera according to claim 13, wherein a shape of the first virtual image plane of the wide-angle main lens is one of a sphere, a hyperboloid, or a curved surface.

16. The light field camera according to claim 13, wherein the curved microlens array comprises at least one sequentially connected microlens, wherein the curved image sensor comprises at least one component image sensor, wherein a quantity of component image sensors is the same as a quantity of microlenses, and wherein each microlens corresponds to one component image sensor; and wherein, for any microlens, a sum of a reciprocal of a vertical distance between the respective microlens and a component image sensor corresponding to the respective microlens and a reciprocal of a vertical distance between the respective microlens and the first virtual image plane of the wide-angle main lens is equal to a reciprocal of a focal length of the respective microlens.

17. The light field camera according to claim 16, wherein the component image sensor is one of a charge coupled device (CCD) or a complementary metal-oxide-semiconductor (CMOS) light sensing component.

18. The light field camera according to claim 13, wherein the curved microlens array comprises at least one sequentially connected microlens, and the curved image sensor is shared by the at least one microlens; and for any microlens, a sum of a reciprocal of a vertical distance between the microlens and the curved image sensor and a reciprocal of a vertical distance between the microlens and the first virtual image plane of the wide-angle main lens is equal to a reciprocal of a focal length of the microlens.

* * * * *